Figure 1A:
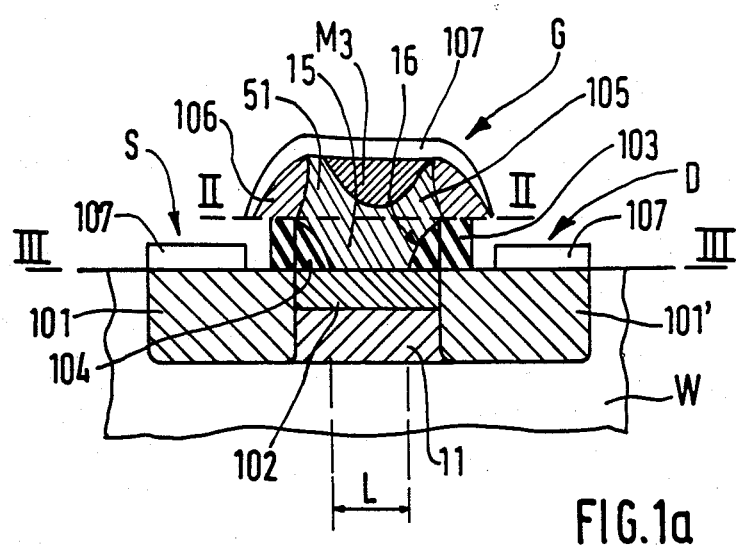

United States Patent [19]

Rabinzohn et al.

[11] Patent Number: 4,892,835
[45] Date of Patent: Jan. 9, 1990

[54] METHOD OF MANUFACTURING A FIELD EFFECT TRANSISTOR

[75] Inventors: Patrick D. Rabinzohn, Saint-Maurice; Christian Rocher, Sucy-en-Brie; Serge Gourrier, Lognes, all of France

[73] Assignee: U.S. Philips Corporation, New York, N.Y.

[21] Appl. No.: 171,990

[22] Filed: Mar. 23, 1988

[30] Foreign Application Priority Data

Mar. 24, 1987 [FR] France ................ 87 04072

[51] Int. Cl.⁴ ............... H01L 21/265; H01L 21/283; H01L 21/314; H01L 29/80
[52] U.S. Cl. .................................. 437/22; 437/41; 437/44; 437/50; 437/177; 437/179; 437/184; 437/912; 437/984; 148/DIG. 105; 156/643; 156/646
[58] Field of Search ............... 437/22, 39, 41, 44, 437/49, 50, 176, 177, 179, 912, 962, 984, 184, 188, 27, 238, 239, 240, 241, 242, 245, 247; 357/15, 22; 156/643, 646, 650, 651, 652, 653, 656, 657, 662, 664; 148/DIG. 105

[56] References Cited

U.S. PATENT DOCUMENTS

| 4,694,564 | 9/1987 | Enoki et al. ................ 437/40 |
| 4,774,206 | 9/1988 | Willer ........................ 437/175 |
| 4,808,545 | 2/1989 | Balasubramanyam et al. ... 437/41 |

FOREIGN PATENT DOCUMENTS

| 0036500 | 9/1981 | European Pat. Off. ........ 357/15 |
| 55-110038 | 8/1980 | Japan ............................ 437/22 |
| 57-103363 | 6/1982 | Japan ............................ 437/175 |
| 59-117172 | 7/1984 | Japan ............................ 437/175 |
| 61-73377 | 4/1986 | Japan ............................ 437/912 |

OTHER PUBLICATIONS

Bohg et al., IBM Technical Disclosure Bulletin, vol. 18, No. 11 (Apr. 1976), pp. 3734-3735.

Primary Examiner—Olik Chaudhuri
Attorney, Agent, or Firm—Paul R. Miller

[57] ABSTRACT

The invention relates to a method of manufacturing a field effect transistor comprising at the surface of a substrate of semi-insulating gallium arsenide W an active n-type active layer (102), on which is formed a gate electrode (G) of the Schottky type having at its lower part (15) the general form of a trapezoid, whose minor base is in contact with the active layer, then comprising on either side of the active layer a region of the n+ type (101 and 101') constituting the source and drain regions, of which the edges adjacent to the active layer are self-aligned with the edges of the major base of the trapezoid, and moreover comprising source (S) and drain (D) electrodes of the ohmic contact type formed at the surface of the regions of the n+ type. This transistor is characterized in that the gate electrode is composed of a weakly resistive metallic layer (105) and comprises an upper part (51) disposed on the major base of the trapezoid having a central metallic region (105) and a peripheral zone (106) of SiO₂, which projects beyond the surface of the major base of the trapezoid, in that the source (S) and drain (D) electrodes (107) are self-aligned with the outer edges of the peripheral zone (106) of the gate, the latter being at right angles to a layer (103,104) of Si₃N₄ separating the electrodes from each other.

22 Claims, 8 Drawing Sheets

METHOD OF MANUFACTURING A FIELD EFFECT TRANSISTOR

The invention relates to a method of manufacturing a semiconductor device of the field effect transistor type comprising at the surface of a semiconductor substrate a layer of a first conductivity type at a first resistivity level, which is designated as an active layer and on which a gate electrode of the Schottky type is formed having in its lower part the general form of a trapezoid, whose minor base is in contact with the active layer, further comprising on either side of the active layer two regions of the same conductivity type at a second resistivity level and constituting the source and drain regions, whose edges adjacent to the active layer are aligned with the edges of the major or upper base of the trapezoid, and moreover comprising source and drain electrodes of the ohmic contact type formed at the surface of the regions of the first conductivity type at a second resistivity level.

The invention further relates to the transistor obtained by this method.

The invention is used in the manufacture of both digital and analogue integrated circuits operating at very high frequencies or having very high cut-off frequencies of the order of several tens of GHz and having a high integration density and a high manufacturing efficiency.

A manufacturing method for obtaining a field effect transistor of the kind described above is known from European patent application No. 0 196 087.

The transistor described in this document has due to the method used a given number of disadvantages.

In the first place, the gate electrode is formed from a refractory metal, such as WSi, i.e. having a very high resistance. In fact, in the method described, the gate contact is formed in a step preceding the formation of the source and drain regions and serves as a mask for the implantation of ions for forming these regions. The metal constituting this gate contact must therefore be sufficiently refractory to promote the implantation annealing treatment carried out at a temperature of the order of 800° C. for 20 minutes. The high resistivity of this refractory metal reduces the noise performances of the field effect transistor and renders it non-compatible with the manufacture of low-noise circuits or analogue integrated circuits. For the manufacture of such circuits, it is therefore primordial to obtain transistors whose gate has a low resistivity.

Moreover, though being refractory, the metal chosen is not sufficiently refractory, however, to avoid a given instability of the metal/semiconductor interface during the implantation annealing treatment.

The method known from the aforementioned document has for its object to permit manufacturing a submicron gate transistor. This dimension of the gate is obtained due to the fact that the latter has the form of a trapezoid whose minor base is in contact with the active layer, while the major base serves as a mask for the self-alignment of the implanted source and drain regions. However, this trapezoidal form is obtained by etching with a beam of ions at a given very small angle, which method has the disadvantage that it is not repetitive. In fact, on the one hand, the speed of erosion depends upon the angle of attack which varies necessarily in accordance with the etching, while, on the other hand during the etching treatment a redeposition is formed at the feet of the trapezoid, which results in that the expected trapezoidal form cannot be obtained. The possibility of obtaining the device described is therefore theoretical and not realistic.

Now, even small variations of the length of the gate, when this length attains submicron dimensions, leads to strong variations of the threshold voltage from one transistor to the other, which are very detrimental to the realization of integrated circuits operating at ultrahigh speed.

Moreover, according to the method known from the aforementioned document, the major base of the inverse trapezoid also serves as a mask for the self-alignment of the source and drain ohmic contacts. However, such an alignment is a very precise operation and it frequently happens, because of the extremely reduced distances between the gate and the source and drain contacts, that shortcircuits appear between these electrodes, which reduces the manufacturing efficiency. It should be noted that during the manufacture of integrated circuits, if a single transistor of a circuit on a wafer does not operate, while the latter comprises several hundreds or several thousands of these transistors, the whole of the circuit of the wafer has to be rejected. The manufacturing method must therefore be as reliable as possible.

The present invention has for its object to provide a semiconductor device and a manufacturing method not suffering from these limitations.

According to the invention, this object is achieved by means of a manufacturing method comprising at least the following steps:

(a) forming a substrate W of a monocrystalline semiconductor material having a surface orientated parallel to a crystallographic plane;

(b) forming at the surface of the substrate a layer of a dielectric material of a first kind;

(c) forming at the surface of the preceding layer a mask $M_2$ defining the major base of the trapezoid constituting the so-called lower part of the gate electrode;

(d) etching around the mask $M_2$ the dielectric layer of the first kind by reactive ion etching (RIE) to obtain a contact $M_1$ of dielectric material of the first kind, on which the mask $M_2$ is disposed;

(e) implanting around a contact $M_1$ serving as a mask and in the opening of a mask $M_0$ defining the periphery of the transistor ions apt to form the source and drain regions of the first conductivity type at the second resistivity level and then eliminating the mask $M_0$ and $M_2$;

(f) depositing at the surface of the device only provided with the contact $M_1$ a layer having a uniform thickness at least equal to that of the contact $M_1$ of dielectric material of a second kind;

(g) planarizing by a known method the device at the level of the upper surface of the contact $M_1$;

(h) eliminating by selective reactive ion etching the contact $M_1$ so as to form an opening of the same surface area in a dielectric layer of the second kind exposing the substrate W;

(i) implanting in this opening moreover defined by the mask $M_0$ ions for forming the active layer of the first conductivity type at the first resistivity level, implantation annealing and eliminating the mask $M_0$;

(j) forming by a known method spacers bearing on the edges of the opening provided in the layer of the dielectric of the second kind, the spacers being made of the dielectric of the second kind and their thickness being provided to reduce the dimensions of the opening to the dimensions desired for the length L of the gate of transistor and to define at the same time the distance between the gate electrode and the source and drain regions;

(k) depositing a layer of the metal of the gate having a thickness exceeding that of the layer of the dielectric of the second kind and then a layer chosen among the dielectric of the first kind or titanium (Ti), these layers having a uniform thickness;

(l) planarizing by a known method the device down to the upper level of the layer of the metal of the gate in such a manner that at the surface of the depression formed in the metallic gate layer above the opening of the layer of the dielectric of the second kind a layer also subsists of the dielectric of the first kind or of titanium constituting a mask $M_3$;

(m) etching the metallic gate layer around the mask $M_3$ by a method chosen between reactive selective ion etching (RIE) or etching by a beam of ions of a neutral gas, this method being chosen in accordance with the metal constituting this layer, to the upper level of the layer of the dielectric material of the second kind in order to form the metallic central region of the upper part of the gate;

(n) forming by a known technique spacers bearing on the edges of the metallic gate layer to form a peripheral dielectric part at the upper metallic part of the gate at right angles to the dielectric layer of the second kind, these spacers consisting of a dielectric material of the first kind and their thickness being provided to define the distance between the source and drain electrodes and the active layer so that the distance between the gate electrode and the source and drain electrodes equals the sum of the thicknesses of the spacers used in the method;

(o) etching the layer of the dielectric material of the second kind by reactive selective ion etching around the contact formed by the upper part of the gate covered by the mask $M_3$ and the spacers of the dielectric material of the first kind to the upper level of the substrate, which etching treatment may be slightly prolonged or extended laterally under the spacers.

This method of manufacturing can moreover be continued by the step of:

(p) depositing at the surface of the preceding device the mask $M_3$ consisting of titanium (Ti), in the opening of the mask $M_0$ defining the periphery of the transistor a layer of a metal for forming an ohmic contact with the semiconductor material to form the source S and drain contacts D, and eliminating the mask $M_0$.

Alternatively, this method of manufacturing may be continued by the step of;

(p') depositing at the surface of the preceding device, the mask $M_3$ consisting of titanium (Ti) or of the dielectric material of the first kind, in the opening of the mask $M_0$ defining the periphery of the transistor a layer of a metal for forming an ohmic contact with the semiconductor material and eliminating the mask $M_0$ and dielectric regions of the first kind by a known "lift-off" method of the metallic layers deposited on these dielectric layers.

The basic idea of the invention may also be applied to a method of manufacturing a field effect transistor, whose gate electrode comprises several fingers.

Thus, the method according to the invention permits obtaining a semiconductor device of the field effect transistor type comprising at the surface of a semiconductor substrate layers (102) of a first conductivity type at a first resistivity level, which are designated as active layers and on which are formed gate electrodes (G) of the Schottky type having in their so-called upper parts (15) the general form of a trapezoid, whose minor base is in contact with the active layer (102), then comprising between each two successive active layers a region (101") of a first conductivity type at a second resistivity level and on either side of the outer active layers two regions (101,101') of the first conductivity type at a second resistivity level constituting the source and drain regions, while the edges of these regions (101, 101', 101") adjacent to these active layers are aligned with the edges of the major or upper base of the trapezoids of the corresponding gates, and moreover comprising source and drain electrodes (S and D; respectively) of the ohmic contact type (107) formed at the surface of the outer regions (101,101') of the first conductivity type at a second resistivity level.

In order to achieve this object, the method then comprises the following steps:

(a') forming a substrate W of a monocrystalline semiconductor material having a surface orientated parallel to a crystallographic surface, (b') forming at the surface of this substrate a layer (1) of a dielectric material of a first kind;

(c') forming at the surface of the preceding layer a mask ($M_2$) defining several fingers corresponding to the major base of each trapezoid constituting the lower part of each gate electrode;

(d') etching around the mask ($M_2$) the dielectric layer of the first kind by reactive ion etching to obtain a contact ($M_1$) of dielectric material of the first kind, on which the mask ($M_2$) is disposed and which has the same form as the latter;

(e') implanting around the contact ($M_1$) serving as a mask and in the opening of a mask ($M_0$) defining the periphery of the transistor ions apt to form the regions of the first conductivity type at the second resistivity level and then eliminating the masks ($M_0$ and $M_2$);

(f') depositing at the surface of the device only provided with the contact ($M_1$) a layer having a uniform thickness at least equal to that of the contact ($M_1$) of dielectric material of a second kind;

(g') planarizing by a known method the device at the level of the upper surface of the contact ($M_1$);

(h') eliminating by selective reactive ion etching the contact ($M_1$) so as to form openings of the same form and surface area in the dielectric layer of the second kind exposing the substrate W;

(i') implanting in these openings moreover defined by the mask $M_0$ ions apt to form the active layers of the first conductivity type at the first resistivity level, implantation annealing and eliminating the mask $M_0$;

(j') forming by a known method spacers bearing on the edges of the openings provided in the layer of the dielectric material of the second kind, these spacers (104) being made of the dielectric material of the second kind and their thickness being provided to reduce the dimensions of the openings to the dimensions desired for the length (L) of the gate fingers of the transistor and to define at the same time the distance between the outer gate fingers and the source and drain regions;

(k') depositing a layer of gate metal having a thickness exceeding that of the dielectric layer of the second kind and then a layer chosen among the dielectric material of the first kind or titanium (Ti), these layers having a uniform thickness;

(l') planarizing by a known method the device to the upper level of the layer of the gate metal in such a manner that at the surface of the depression formed in the metallic gate layer above the opening of the dielectric layer of the second kind also a layer subsists of the dielectric material of the first kind or titanium constituting the mask $M_3$;

(m') etching around the mask $M_3$ the metallic gate layer by a method chosen among selective reactive ion etching (RIE) or etching by a beam of ions of a neutral gas, this method being chosen in accordance with the metal constituting this layer, to the upper level of the layer of the dielectric material of the second kind, to form the metallic central region of the so-called upper part (51) of the gate fingers;

(n') forming by a known technique spacers bearing on the edges of the metallic layer of the upper part of the gate fingers at right angles to the dielectric layer of the second kind, these spacers being made of a dielectric material of the first kind and their thickness being provided on the one hand to define the distances between the source and drain electrodes and the adjacent active zones so that the distance between the source electrode and a gate finger or a gate finger and the drain electrode equals the sum of the thicknesses of the spacers used in the method and their thickness being provided on the other hand in order that the spacers of the upper gate part of two adjacent gate fingers are in contact so that the distance between two adjacent gate fingers equals double the sum of the thicknesses of the spacers used in the method;

(o') etching the layer of the dielectric material of the second kind by selective reactive ion etching around the contact formed by the upper gate part covered by the mask $M_3$ and spacers of a dielectric material of the first kind to the upper level of the substrate;

(p') depositing at the surface of the preceding device, the mask $M_3$ being made of titanium (Ti) or of a dielectric material of the first kind, in the opening of the mask $M_0$ defining the periphery of the transistor a layer (107) of a metal apt to form an ohmic contact with the semiconductor material to form the source (S) and drain (D) contacts and then eliminating the mask $M_0$ and the dielectric regions of the first kind (106) and, as the case may be, $M_3$, taking along by a known "lift-off" method the metallic layers deposited on these dielectric layers.

The device obtained by the method according to the invention then has inter alia the following advantages:

the transistor according to the invention can have a gate contact, whose length is much smaller than 1 /$\mu$m; and this gate length can be reduced as much as is suitable because it is defined in a very repetitive manner by an opening between two parts of a dielectric layer and not by etching of a metallic contact;

the gate can be constituted by a metal which is not very resistive because it need not maintain during the manufacturing method temperatures as high as those of an implantation annealing treatment and need therefore not be constituted by a refractory metal. In fact, the choice of the materials for realising the device is not limited by any technical condition;

the resistance of the gate is further reduced by the fact that the surface of the section of the gate is large, although the length of the gate is small. The upper surface of the gate, on which the contact is formed, is also large;

the gate thickness can be very large, which suppresses the step of rethickening of the gate included in the methods according to the prior art;

the gate length of the transistors is very repetitive from one transistor to the other. The transistors obtained can be utilized both in digital circuits and in analogue circuits;

the shortcircuits between the gate and the other contacts are impossible due to the fact that they are insulated by dielectric zones;

all elements of the transistor—source, drain and gate regions, source and drain electrodes—are self-aligned with respect to each other, which permits of obtaining a very compact transistor and hence a high integration density.

The edges of the source and drain electrodes are not aligned on the edge of the implanted source and drain regions, but are located at a slightly larger distance from the gate due to the fact that they are self-aligned on the edge of the peripheral dielectric gate region, which increases the manufacturing efficiency while reducing the risk of shortcircuits, but without diminishing the compactness of the device.

This method according to the invention itself has inter alia the following advantages:

the number of masks required for the definition of the transistor is reduced to two, i.e. $M_0$ and $M_2$, which is much smaller than the number of masks generally necessary for the definition of a transistor, i.e. typically 5 to 7;

the method is very reliable. The manufacturing efficiency is very high. The transistors are very repetitive and their performances show a very small dispersion from one transistor to the other;

in this process, not a single under-etching considered as a not very reproducible method is used;

all elements are self-aligned and not simply aligned;

not a single chemical etching treatment is used, but on the contrary reactive ion etching steps are employed;

all manufacturing steps can practically be carried out in the same space;

all the required reactive ion etching steps can be realized due to the choice of the materials constituting the transistor sole by means of two gases or combinations of gases.

Figure 1B:
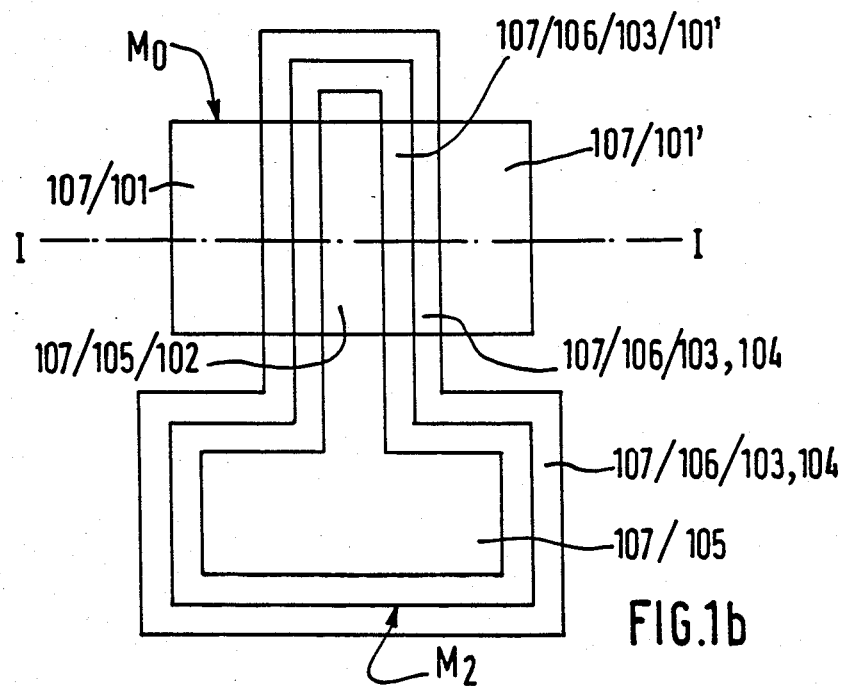
Figure 1C:
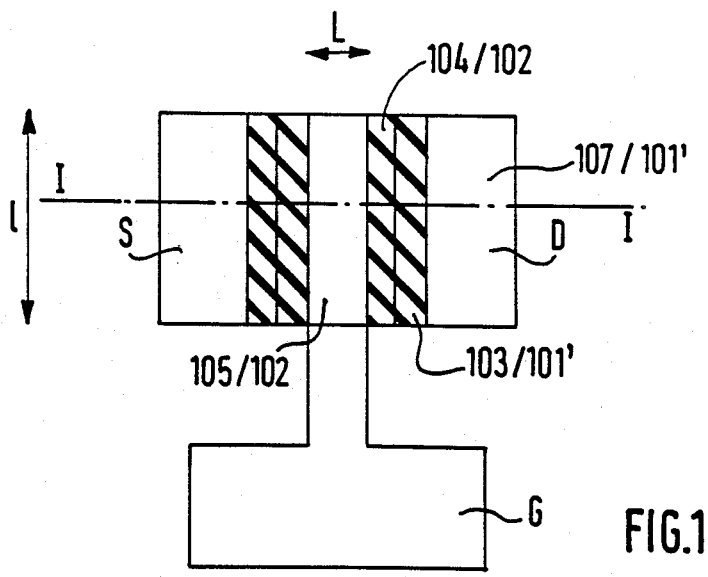
Figure 1D:
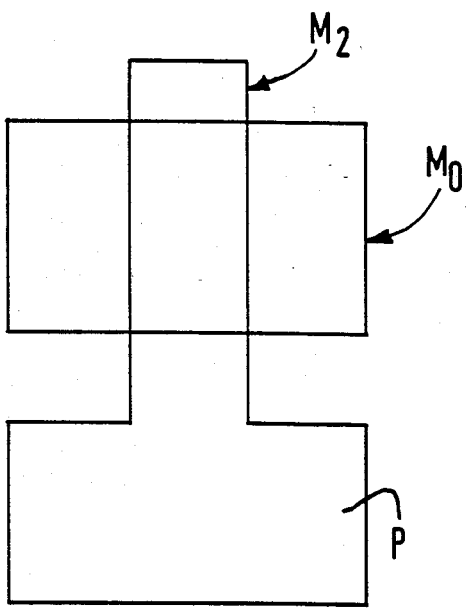
Figure 2A:
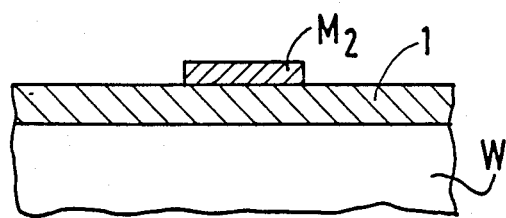
Figure 2B:
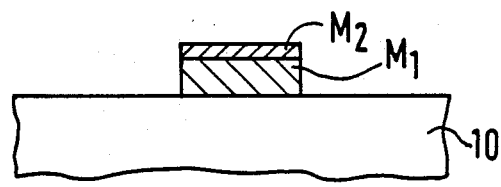
Figure 2C:
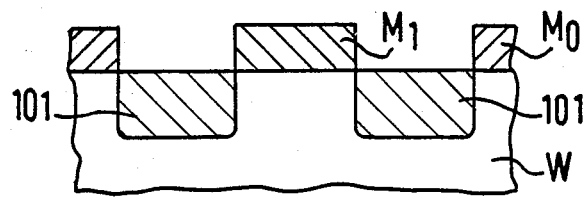
Figure 2D:
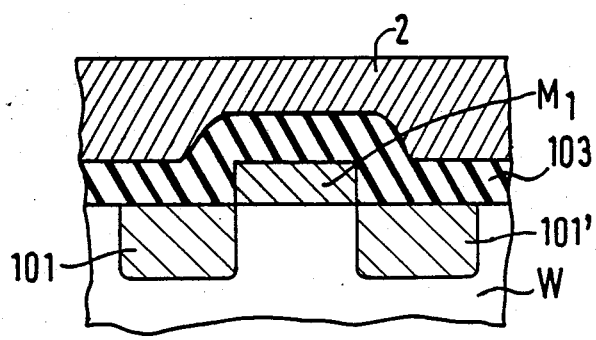
Figure 2E:
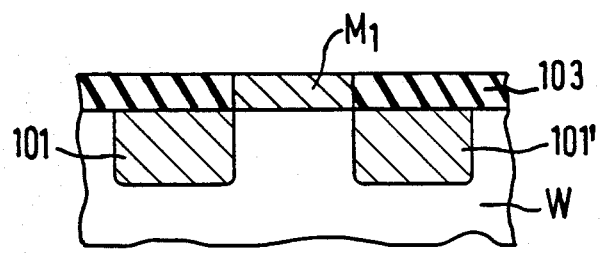
Figure 2F:
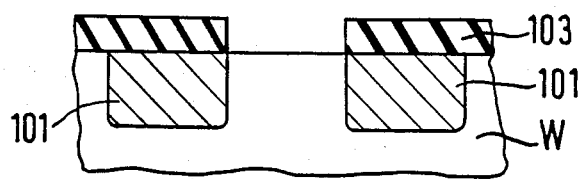
Figure 2G:
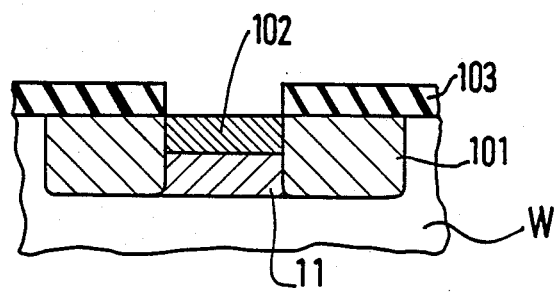
Figure 2H:
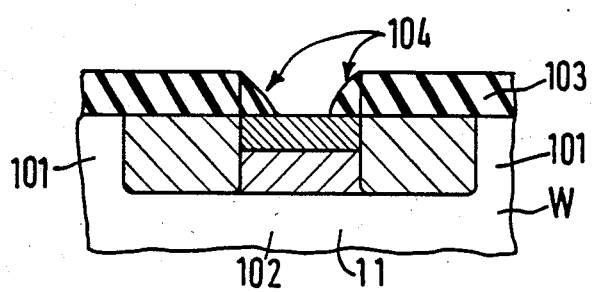
Figure 2I:
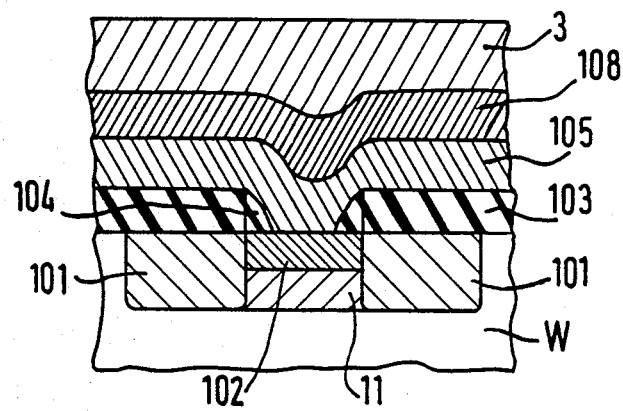
Figure 2J:
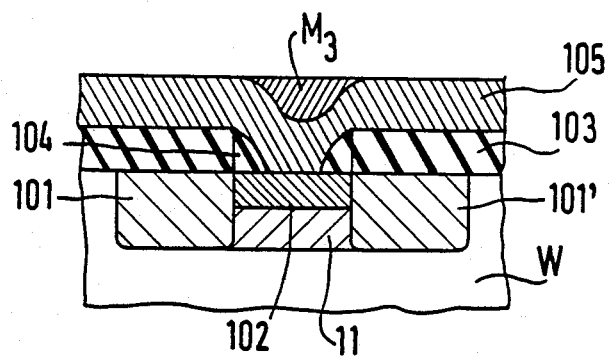
Figure 2K:
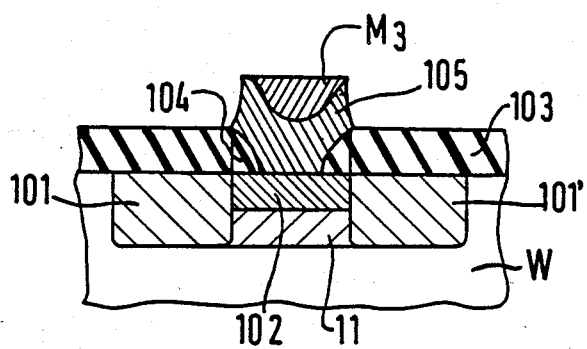
Figure 2L:
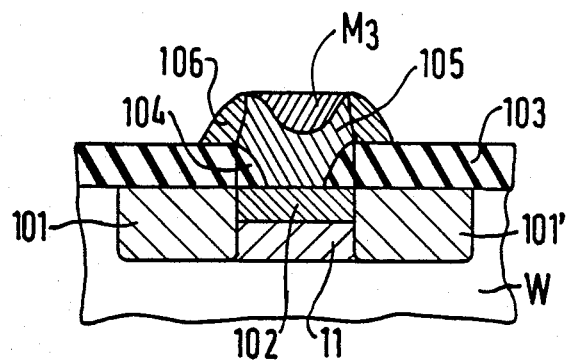
Figure 2M:
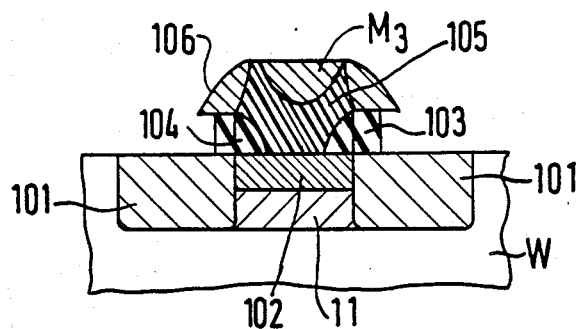
Figure 2N:
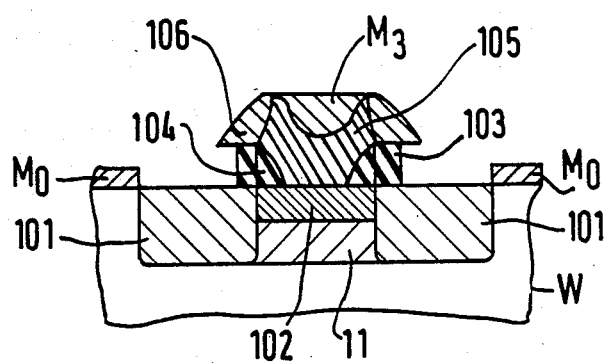
Figure 3A:
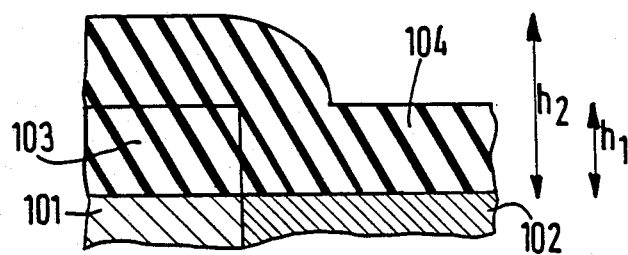
Figure 3B:
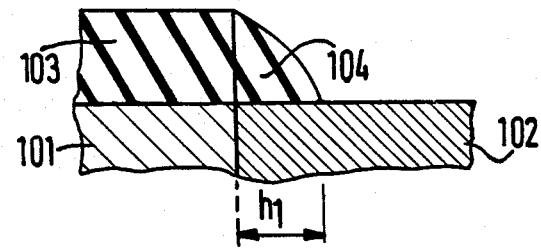
Figure 4A:
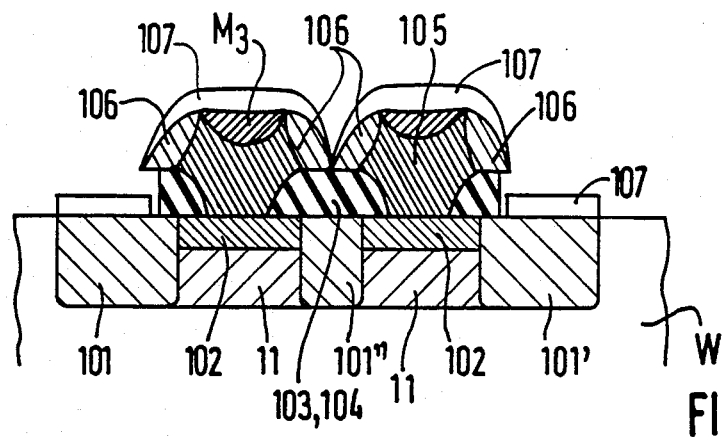
Figure 4B:
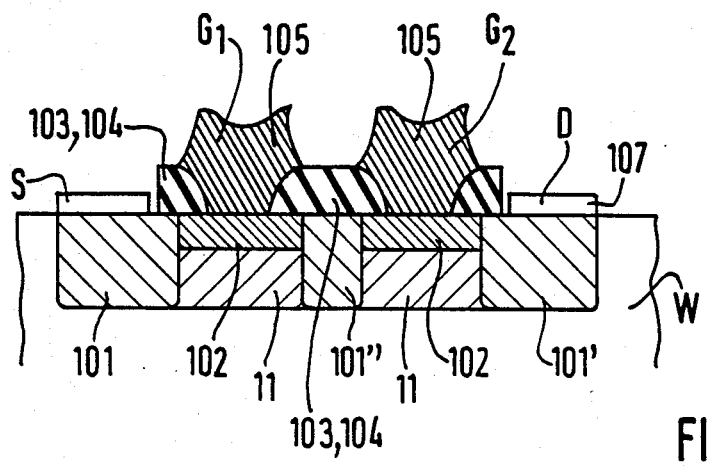
Figure 5A:
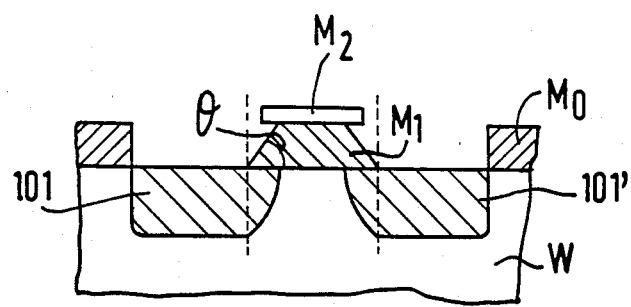
Figure 5B:
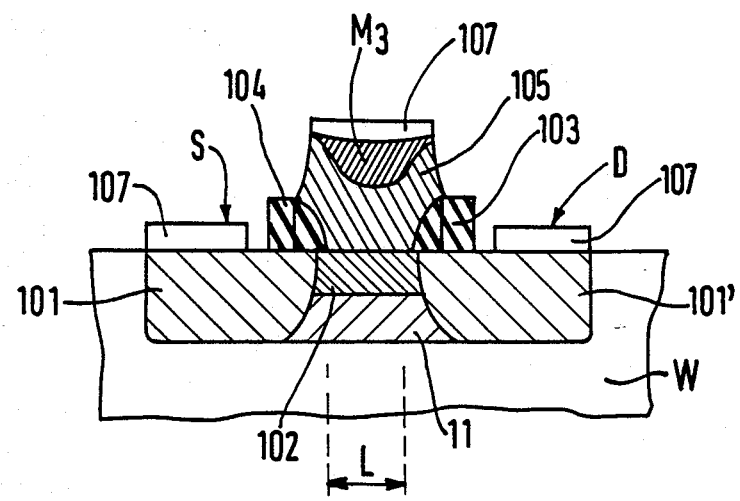

The invention will be understood more clearly by means of the following description illustrated by the accompanying Figures, of which:

FIG. 1a shows diagrammatically the semiconductor device according to the invention in a sectional view taken on the axis I—I of FIG. 1b, FIGS. 1b, 1c and 1d show diagrammatically the semiconductor device according to the invention in plan view, FIGS. 2a to 2n show the device according to the invention at the different stages of the manufacturing method in a diagrammatic sectional view, FIGS. 3a and 3b show the steps of forming a spacer in a diagrammatic sectional view, FIGS. 4a and 4b show the steps of the method of manufacturing a two-gate transistor, FIGS. 5a and 5b show the steps of the method of manufacturing a transistor comprising source and drain regions having a variable thickness.

In the following description, the term "self-alignment" is to be understood to mean a method of manufacturing utilizing an element of the transistor as a reference, for example as a mask for forming another element of the transistor. It is clear that the formation of elements by means of a method of self-alignment is more precise, more repetitive, has a higher definition and reduces the number of necessary steps compared with the formation of these elements by means of a simple alignment method, i.e. by means of masks.

The term "under-etching" is to be understood to mean in a method including the step of etching a layer protected by a mask the lateral etching of the material of the layer present under the mask, which lateral etching has a dimension equivalent to the etching effected at the same time in the perpendicular direction. Such an underetching is generally obtained by wet etching, that is to say by the action of liquid chemical compounds. Now in the manufacture of integrated circuits not a single transistor is realized, but several hundreds of transistors are realized, which are distributed over the whole surface of a wafer to form a circuit. The chemical etching of the elements located at the edge of the wafer is never equivalent to the chemical etching of the elements located at the center of the wafer. Such an underetching can also be obtained by reactive ion etching. However, it can be controlled only with difficulty and is non-uniform on the assembly of a wafer. Therefore, these methods are particularly avoided in the process of manufacturing the device according to the invention.

A manufacturing method which permits obtaining transistors having a low gate resistance is known from the publication entitled "GaAs LSI-directed MESFET's with Self-Aligned Implantation for n+ layer Technology" (SAINT) in I.E.E.E., Vol. ED-29, No. 11, November 1982 by Kimiyoshi Yamasaki et al. However, the transistors obtained by the method described in this document have a gate defined by an under-etching, which above all must be avoided for the reasons given hereinbefore. The method described comprises the step of forming a fictive gate occupying the position of the ultimate gate during the implantation of the source and drain regions. This fictive gate is therefore formed by means of under-etching. It is eliminated at a subsequent stage of the method and is replaced by the ultimate gate.

The present invention also proposes a transistor having a low gate resistance, which gate lies in the submicron range and has a compact structure, but is manufactured by a more repetitive and simpler method.

As shown in plan view in FIG. 1c taken on the plane III—III of FIG. 1a, the device according to the invention constitutes a field effect transistor of the MESFET type (Metal-Semiconductor Field Effect Transistor) comprising a gate electrode G, a source electrode S and a drain electrode D formed at the surface of a semiconductor substrate W.

As shown in FIG. 1a in a sectional view taken on the axis I—I of FIG. 1c, this device comprises an orientated monocrystalline semiconductor substrate W which has a surface orientated parallel to a crystallographic surface on which the different elements of the transistor are formed.

This substrate W is preferably made of a compound of the III-V group, such as, for example, gallium arsenide (GaAs), which is particularly favourable for the formation of hyper-frequency or high-speed devices. The substrate W is chosen, for example, to be semi-insulating.

The transistor according to the invention is formed at the surface of this substrate W. It comprises an active layer 102 of a first conductivity type and at a first resistivity level and source and drain regions 101 and 101', respectively, of the same conductivity type and at a second resistivity level disposed on either side of the region 102 at the first resistivity level. This transistor may comprise a region 11 of a second conductivity type disposed under the active layer.

Favourably, the active layer will be of the n-type, the source and drain regions will be of the n+ type and the layer 11 disposed under the active layer 102 will be of the p-type.

This transistor then comprises at the surface of the active layer 102 the gate electrode G constituted by a metallic layer 105 suitable to form a Schottky contact with the semiconductor material. As to its shape, the gate G has a lower part 15 and an upper part 51 defined by the axis II—II.

The lower part 15 has a substantially trapezoidal form, whose lateral surfaces 16 are slightly curved, however. The minor base of the trapezoid or the lower base is in contact with the active layer 102 of the semiconductor material and its edges define the dimensions of the gate electrode:

its length L, which should be less than 1 /$\mu$m and which extends in the plane of FIG. 1a;

its width l larger than 1 /$\mu$m and perpendicular to the plane of FIG. 1a (cf. FIG. 1c).

The edges of the major base of the trapezoid or upper base, which are perpendicular to the plane of FIG. 1a and parallel to the width l of the gate G, are self-aligned with the edges of the source and drain regions 101 and 101', respectively, adjacent to the active layer 102.

The upper part 51 of the gate G comprises a central region constituted by the metallic layer 105 and a peripheral region 106 of a dielectric material of a first kind.

The peripheral region 106 projects on all sides beyond the upper surface or major base of the trapezoid and is at right angles to a dielectric layer formed by the parts 103 and 104. The source and drain electrodes S and D, respectively, formed by the metallic layer 107 are self-aligned with the outer edge of the peripheral region 106. The layer 103, 104 is made of a second kind of dielectric material and the layer 107 is made of an alloy suitable to form a contact of the ohmic type with the semiconductor material.

Advantageously, the metallic layer 105 forming the gate contact is a multi-layer comprising the superimposition of:

a tungsten (W) layer having a thickness of about 200 nm, a tantalum (Ta) layer having a thickness of about 100 nm and an upper gold (Au) layer having a thickness larger than 500 nm, or:

a tungsten nitride (WN) layer, having a thickness of about 200 nm, a tantalum nitride (TaN) layer having a thickness of about 100 nm and an upper gold (Au) layer having a thickness larger than 500 nm, or:

a tungsten (W) layer having a thickness of about 100 nm and an upper gold (Au) layer having a thickness larger than 500 nm.

According to this advantageous arrangement of a multi-layer for forming the gate metallization of the Schottky type, a tungsten layer of small thickness with respect to the overall thickness of the multi-layer is utilized and arranged so as to be in contact with the active layer of the semiconductor material. The use of this refractory material of small thickness serves to obtain a high temperature stability of the metal-semiconductor interface without rendering the gate resistive, however. In fact, if the manufacturing method described below is centered on the fact that the implantation annealing treatments carried out at a high temperature are terminated before the formation of the gate metallization, nevertheless this metallization is already in position when the device is brought to the temperature of alloying the ohmic contact metals. If the stability of the tungsten was at its limit for maintaining the implantation annealing treatment (800° C.), this stability is then on the contrary perfect even when the tungsten is present as a thin layer during the formation of the ohmic contact alloy (about 450° C.).

On the other hand, in this preferred embodiment of the device according to the invention, the first kind of dielectric forming the peripheral upper region of the gate is chosen to consist of silica ($SiO_2$) and the second kind of dielectric forming the layer insulating the gate from the other electrodes is chosen to consist of silicon nitride ($Si_3N_4$).

The choice of these different dielectrics will permit obtaining etching steps selective with respect to each other, while the choice of the metals forming the gate will permit, besides the aforementioned advantages, etching the gate metal by the same method as that which permits etching the silicon nitride and in sequence of uninterrupted operations.

In this preferred embodiment of the device according to the invention, the source and drain electrodes are formed from a gold-germanium-nickel (Au-Ge-Ni) alloy forming a layer having a thickness of 0.5 to 1 $\mu m$ forming an ohmic contact with the semiconductor material.

Different variations of the device according to the invention are possible.

According to a first variation, the upper part of the gate can be covered by a layer $M_3$ of titanium (Ti) having a thickness of about 100 nm (which is the case for the device shown in FIGS. 1a and 5b.).

According to a second variation, with or without the preceding layer $M_3$ of titanium, the gate can be covered by a layer (107) of the ohmic contact metal, which is the case for the device shown in FIGS. 1a and 5b.

In a third variation, the peripheral region 106 can be eliminated taking along with it the metallic layers which may cover it (method known as "lift-off") (cf. FIGS. 5b and 4b).

In this latter variation (cf. FIG. 4b), the device according to the invention can be a two-gate (or multigate) transistor. In fact, this device can comprise two or several gate electrodes $G_1$, $G_2$... disposed between the source and drain electrodes, these gate electrodes being spaced apart by a distance equal to twice the transverse dimension of the peripheral dielectric region (cf. FIG. 4a). Thus, before the elimination of the peripheral regions 106, the peripheral regions of two contiguous gates are in contact with each other. The peripheral regions are eliminated at the end of the manufacturing method to eliminate by "lift-off" the metallic layers covering them and thus to avoid the shortcircuits between the various gate metallizations. If the layer $M_3$ consists of silica, the assembly of the metallization 107 deposited on the gates is eliminated (FIG. 4b).

In such a two- or multi-gate device, each gate is formed at the surface of an active layer 102 and each active layer of the first conductivity type at the first resistivity level is separated from another such layer by a region 101" of the same conductivity type at the second resistivity level. Moreover, each gate is separated from the contiguous gate by a layer of dielectric material of the second kind 103,104.

Dimensions of transistors particularly suitable to form digital or analogue integrated circuits are as follows:

gate length L: less than 1 $\mu m$;
distance between regions of the second conductivity type measured in the plane of FIG. 1a: 1 to 2 $\mu m$;
distance between ohmic contact and gate measured in the plane of FIG. 1a: 0.5 to 2 $\mu m$;
implantation depth of the active layer of the first conductivity type: 50 to 300 nm; and
implantation depth of the drain and source regions of the first conductivity type at the second resistivity level: 100 to 500 nm.

In another variation of the device (cf. FIG. 5b) according to the invention, the source and drain regions 101 and 101', respectively, are given a progressive depth from that of the active layer 102. This technique permits inter alia reducing the contact resistances of the transistor and also improving the detrimental effects due to the narrowness of the channel. The latter effects are moreover attenuated by the implantation of the region 11 of the second conductivity type.

According to the present invention, an advantageous manufacturing method is proposed of obtaining this device.

This method comprises the following stages:

(a) forming a substrate W of a monocrystalline semiconductor material having a surface orientated parallel to a crystallographic surface. Favourably, this substrate will consist of gallium arsenide (GaAs) and the surface will be orientated parallel to the crystallographic surface (100).

(b) forming a layer 1 of a dielectric material of a first kind. This layer could have a thickness of 100 to 500 nm and be formed from silica ($SiO_2$) (cf. FIG. 2a).

(c) Forming at the surface of the layer 1 a mask $M_2$, for example of photosensitive lacquer having a thickness of 500 to 1000 nm. The dimension of this mask along the axis I—I of FIG. 1b is of the order of 1 to 2 $\mu m$, and its manufacture is not very critical. This dimension defines the distance between the source and drain regions 101 and 101', respectively. This mask $M_2$ moreover defines the gate contact connection P, as shown in plan view in FIGS. 1b and 1d. In a general manner, this mask $M_2$ has the form and the dimensions of the major base of the trapezoid forming the lower region (15) of the gate.

(d) etching around the mask $M_2$ the dielectric layer 1 of the first kind to obtain a contact $M_1$. When the dielectric chosen for the layer 1 is silica, this etching step is effected by reactive ion etching (RIE) by means of pure $CHF_3$ or $CF_4$ gases (cf. FIG. 2b). In this embodiment, the source and drain regions 101 and 101', respectively, will have a constant thickness. By this etching step, the contact $M_1$ has the same dimensions as the mask $M_2$;

($d_o$) This step is an alternative to the preceding step (d) and permits obtaining source and drain regions 101 and 101', respectively, having a thickness increasing from the active layer 102, as shown in FIG. 5a and the following Figures. For this purpose, the dielectric layer 1 is etched under different conditions, for example by means of different gases, in order to obtain on the one hand a slight lateral etching of the mask $M_2$ and then a contact $M_1$ having lateral surfaces enclosing with the surface of the semiconductor an angle $\theta$ of the order of 40° to 80°. When the dielectric layer 1 is made of silica ($SiO_2$), this arrangement is obtained by reactive ion etching (RIE) by means of gases, for example $SF_6$ or $O_2$ mixed with $CHF_3$ or $CF_4$;

(e) implanting around the contact $M_1$ serving as a mask and in the opening of a mask $M_0$ defining the periphery of the transistor ions for forming the source and drain regions 101 and 101', respectively, of the first conductivity type at the second level of resistivity (cf. FIGS. 5a and 2c). The mask $M_0$ can consist of photosensitive lacquer or of dielectric material of the second kind. In the latter case, it will remain in place during the whole process of manufacturing. In order to obtain n+ type regions in gallium arsenide, silicon (Si) ions can be implanted having a concentration of the order of $10^{17}$ to $10^{18}$ per $cm^3$. If the edges of the contact $M_1$ are inclined, the penetration depth of the ions decreases from the base of the inclination so as to become low in the region corresponding to the height of the inclination, which permits obtaining the desired variation of the thickness of the regions 101 and 101' (cf. FIG. 5a). The masks of photosensitive lacquer $M_2$ and, as the case may be, $M_0$ if the latter consists of lacquer are then removed;

(f) depositing at the surface of the device only provided with the contact $M_1$ (cf. FIGS. 1a and 2d) a layer 103 having a uniform thickness and consisting of a dielectric material of a second kind. This dielectric material of a second kind will advantageously be silicon nitride ($Si_3N_4$) having a thickness at least equal to that of the contact $M_1$, i.e. 200 to 600 nm;

(g) this step consists in obtaining the planarization of the device at the level of the upper surface of the contact $M_1$ (FIG. 2e). For this purpose, a technique may be used known, for example, from the publication "Two-Layer Planarization Process" by A. Schitz and M. Pons in J. Electrochem. Soc., Vol. 133, No. 1, January 1986. A simpler method with one layer may also be used. This technique essentially consists in applying to the surface of a device having surface irregularities, such as the contact $M_1$, a thick layer 2 of a material such as a photosensitive lacquer (cf. FIG. 2d). This layer 2 is then subjected to an insolation at an energy about three times higher than the insolation energy in the usual operating conditions and then to a temperature of the order of 150° to 200°, which permits causing the resin to flow and hence obtaining for the layer 2 a substantially flat upper surface. This layer is then subjected to a reactive ion etching treatment by means of $SF_6+CHF_3$ gases;

(h) eliminating the contact $M_1$ so as to leave an opening 20 of the same surface area in the layer 103 of dielectric material of the second kind. In the case in which the contact $M_1$ consists of silica ($SiO_2$) and the layer 103 consists of silicon nitride ($Si_3N_4$), this elimination is obtained by selective reactive ion etching by means of pure $CHF_3$ gas at a high pressure. If the contact $M_1$ has inclined edges, a more satisfactory result will be obtained for the same materials with a mixture of gases $CHF_3$, $SF_6$ (cf. FIG. 2f);

(i) implanting in the opening 20 thus provided in the layer 103 of the dielectric material of the second kind ions to form the active layer 102 of the first conductivity type (cf. FIG. 2g). In order to obtain an active layer of the n-type in gallium arsenide, silicon (Si) ions can be implanted at a concentration of the order of $5 \times 10^{16}$ to $5 \times 10^{17}$ per $cm^3$;

($i_o$) an alternative to the preceding step consists in implanting, before forming the active layer of the first conductivity type at the first resistivity level, a deep layer 11 of a second conductivity type, for example, p-type. In order to obtain a deep p-type layer in gallium arsenide, beryllium (Be) or magnesium (Mg) ions can be implanted with a high energy at a concentration of the order of $10^{16}$ to $10^{17}$ per $cm^3$. Subsequently, the active n-type layer is implanted, as described in step (i), and an implantation annealing treatment is carried out (about 800° C. for about 20 minutes);

(j) forming in the opening 20 of the layer of the second kind of dielectric material 103 spacers 104 of the same dielectric material (cf. FIG. 2h). These spacers 104 are formed by means of a technique described in the publication entitled "Etch-Defined Patterning of Hyperfine Refractory Metal Silicide MOS Structure" by Shiniji Okazaki in I.E.E.E. Transactions on Electron Devices, Vol. ED-28, No. 11, November 1981, pp. 1364–1368. The use of this technique in the formation of the present device is illustrated in FIGS. 3a and 3b. A layer 104 of the same dielectric material as the layer 103, i.e. of the dielectric material of the second kind, is deposited uniformly on the device and has a very precise thickness $h_1$ chosen for the dimension of the spacers. The thickness of the layer 104 is therefore $h_1$, while the overall thickness of the layers 103 and 104 is $h_2$. Subsequently, such a reactive ion etching treatment is carried out on the device that an identical thickness of the material 104 is removed at each point. The thickness of material 104 being practically equal to $h_2$ along the edges of the opening 20 in the layer 103 (cf. FIG. 3a), after this etching treatment along these edges a part of the layer 104 is left, which is supported thereon and has the lateral dimension $h_1$ obtained with a precision $\approx 1\%$ (cf. FIG. 3b). This remaining layer part 104 is designated as a "spacer". The spacer serves to modify for example the limit of a mask. In this case, the spacers 104 modify the opening 20 provided in the layer 103 (cf. FIG. 2h) and are provided so that an opening subsists equal to the gate length L desired for the transistor. Typically, a dimension is chosen of the order of 0.5 $\mu m$. This method is extremely precise and repetitive, in contrast with the prior art. If the layer 103 consists of silicon nitride ($Si_3N_4$), the layer 104 also consists of silicon nitride ($Si_3N_4$);

(k) depositing on the device thus formed a layer 105 of the gate metal of the order of 700 to 1200 nm and then a layer 108 of a material chosen among the dielectric material of the first kind or a metal such as titanium (Ti) of 200 to 500 nm thickness and subsequently a layer 3 of, for example, photosensitive lacquer or any material that can be used in a planarization technique of the kind described above (cf. FIG. 2i). The gate metal is advantageously a multi-layer of tungsten (W), tantalum (Ta), gold (Au) having thicknesses of about 200 nm, 100 nm and more than 500 nm, respectively, or a multi-layer of tungsten nitride (WN), tantalum nitride (TaN), gold (Au) having thicknesses of about 200 nm, 100 nm and more than 500 nm, respectively, or a multi-layer of tungsten (W) and gold (Au) having thicknesses of about 200 nm, and more than 500 nm, respectively;

(l) planarizing the device to the upper level of the metallic layer 105. For the materials indicated above, the planarization can be effected by RIE by means of $CHF_3+SF_6$ gases, these gases being used if the layer 108 consists of silica ($SiO_2$) as well as if it consists of titanium (Ti) (cf. FIG. 2j). At the end of this planarization, at the surface of the upper part of the gate a region $M_3$ is left constituted by the dielectric material of the first kind (SiO$_2$) or constituted by titanium (Ti). This region M$_3$ will serve as a mask for the following step:

(m) etching the metallic gate layer 105 around the mask M$_3$. If the metallic layer 105 is one of the multilayers described above, the upper layer consists of gold (Au). The gold is etched by means of a beam of ions of a neutral gas, which produces a purely mechanical action. The subjacent layers of tantalum (Ta) and tungsten (W) or their nitrides are etched by reactive ion etching by means of CHF$_3$+SF$_6$ gases. The etching treatment is continued to the upper level of the layer of the dielectric material of the second kind 103. The gate then has two parts: a lower part 15 under the level of the layer 103, which lower part has roughly the form of a trapezoid, whose minor base is in contact with the active layer 102, and an upper part 51, which forms a contact covered by the mask M$_3$. At this stage, if the mask M$_3$ consists of silica (SiO$_2$), it can be removed;

(n) forming by the technique described above spacers 106 of dielectric material of the first kind (SiO$_2$). These spacers 106 form a peripheral region projecting beyond the upper part of the metal 105 and arranged at right angles to a part of the layer 103 of the dielectric material of the second kind (Si$_3$N$_4$). The outer edge of these spacers 106 is provided to define the edge of the source and drain contacts (cf. FIG. 2f).

Since the method according to the invention permits obtaining a thick gate, the advantage is utilized of forming the spacers 106, which in turn will permit a self-alignment of the ohmic contacts;

(o) etching the layer 103 of the dielectric material of the second kind by RIE. If the layer 103 consists of silicon nitride, this etching step is carried out by means of CHF$_3$+SF$_6$ gases (cf. FIG. 2f). At the end of this operation, the gate is constituted by the metallic part 105, whose surface in contact with the semiconductor is the minor base of the trapezoid, by the peripheral part 106, which is at right angles to the remaining parts of the layers 103,104 of dielectric material of the second kind, and, as the case may be, by the mask M$_3$. The peripheral part 106 consists of dielectric material of the first kind, but the mask M$_3$ may consist either of the same dielectric material or of titanium (Ti). The layer 103 can be slightly under-etched with respect to the outer edges of the peripheral region 106. These outer edges will serve to define the metallic source and drain contact layers. However, if the mask M$_3$ consists of silica and it has not yet been removed, it is maintained for the following step;

(p) forming the ohmic source and drain contacts 107 in the opening left between the mask M$_0$ and the mask constituted by the gate in the state of step (o). The metal of the layer 107 will be advantageously formed by vapour deposition in vacuo or by cathode sputtering of a gold-germanium alloy and then vapour deposition or sputtering of a nickel layer; and subsequently formation of the goldgermanium-nickel alloy at about 450° C. The thickness of the ohmic contact layers will advantageously lie between 0.5 and 1 /μm. The gate as constituted at this stage maintains very satisfactorily such a temperature. This stage is favourable in the case in which the mask M$_3$ consists of titanium (Ti). In fact, the metal of the layer 107 is also deposited on the gate. However, the latter being entirely metallic except the peripheral regions 106, the excess thickness caused by the metal 107 and over a large surface area due to the regions 107 is very favourable for the reduction of the resistivity of the gate contact.

If the mask M$_3$ does not consist of titanium (Ti), the step (p'), which is an alternative to the step (p), has to be carried out after the step (o).

(p') forming the ohmic source and drain contacts 107 in the opening left between the mask M$_0$ and the mask constituted by the gate in the state of the step (o). The metal of the layer 107 will also be constituted, as in the step (p), advantageously by a gold-germanium alloy covered by a nickel layer with formation of the gold-germanium-nickel alloy at 450° C. The thickness of this layer will again be of the order of 0.5 to 1 /μm.

However, if the mask M$_3$ consists of dielectric material, it must necessarily be removed at the end of the deposition of the layer 107 in order to obtain again an upper metallic surface for the gate in order to form the subsequent joints and connections.

Since the mask M$_3$ is constituted by the same dielectric material as the peripheral regions 106, the removal of the mask M$_3$ is in this case subordinate to the removal of the peripheral regions 106.

If the regions M$_3$ and 106 are constituted by silica, they are removed, for example, by wet etching by means of buffered solutions on the basis of hydrofluoride.

Alternatively, only the peripheral regions 106 may be removed in another variation of the method, even if the mask M$_3$ consists of titanium (Ti).

One of these two variations must necessarily be used to obtain instead of the one-gate transistor described above a transistor having several gate fingers.

The formation of such a transistor is illustrated in FIGS. 4a and 4b. As shown in these Figures in a sectional view, a transistor having several gate fingers is formed on a substrate W. It comprises a number of active layers 102 equal to the number of gate fingers. The active layers 102 are separated from each other by regions 101" of the same conductivity type as the source and drain regions 101 and 101', respectively, which are arranged on either side of the outer gate fingers.

The manufacture of such a transistor is based on the choice of the dimension designated by h$_1$ of each spacer 104 and 106 used in the method. In fact, according to the invention, the device obtained at the end of step (n) must be such that the spacers 106 between two contiguous gate fingers are in contact in order to avoid in the subsequent step that the layers 103, 104 between two gate fingers are etched. This is obtained by ensuring that the distance between two gate fingers is equal to twice the width h$_1$ of the spacer 104 plus twice the width h$_1$ of the spacer 106.

More particularly, in order to form several gate fingers, it is necessary that during the step (h) a number of openings 20 is formed equal to the number of gate fingers in order that accordingly the active layers can be formed. The spacers 104 will be applied to each of these openings 20.

FIG. 4a shows that the spacers 106 in this case solely serve for use in the self-alignment method. They are eliminated to obtain the multi-gate transistor shown in sectional view in its ultimate shape in FIG. 4b. However, the top of the gate contacts of the multi-gate transistor can retain the mask M$_3$ if the latter consists of titanium (Ti), as in FIG. 5b.

In order to obtain the multi-gate transistor according to the invention, it is therefore sufficient to carry out again the steps of the method proposed for the one-gate transistor while providing for these steps the small modifications described above.

In one as well as in the other mode of operation, the operations can succeed each other without leaving the substrate wafer W of the structure. In fact, in a general manner, the materials have been chosen to permit the continuous sequence of the operations. Thus, the silica ($SiO_2$) is subjected to the reactive ion etching (RIE) treatment with the pure $CHF_3$ or $CF_4$ gas at a high pressure, while all the other materials, except gold, which is subjected to a mechanical etching treatment, can be subjected to RIE with the mixture of the gases $CHF_3 + SF_6$.

Finally, there can be introduced between the step (h) and the step (i) or ($i_o$) a step of:

($h_o$) forming a depression in the active layer 102 for defining a region, in which the thickness of the channel is smaller. This depression is obtained, for example, by chemical etching of the active layer 102 in the region defined by the spacers 104 or, which is less favourable, in the present state of the art by RIE. If the substrate consists of gallium arsenide, the etching treatment is preferably carried out by means of solutions comprising, for example, citric acid, peroxide of hydrogen and water.

The variations described in $d_o$, $i_o$ and $h_o$ may also be used to obtain the multi-gate transistor.

What is claimed is:

1. A method of manufacturing a field effect transistor semiconductor device comprising the steps of
   (a) forming a substrate of a monocrystalline semiconductor material, said substrate having a surface orientated parallel to a crystallographic plane of said semiconductor material,
   (b) forming a first layer of a first dielectric material at said surface,
   (c) forming at least one first mask on said first layer
   (d) etching said first layer relative to said first mask by reactive ion etching to obtain at least one first dielectric area of said first layer having a shape of said first mask, said first mask being disposed on said first dielectric area,
   (e) forming a second mask at a spacing around said first dielectric area to expose portions of said substrate through a first opening,
   (f) implanting ions into said substrate through said first opening to form source and drain regions of a first conductivity in said substrate, said source and drain regions having a first resistivity different from a resistivity of said substrate,
   (g) removing said second mask,
   (h) forming at least one second layer over each of said first layer, said source and drain regions, and said substrate, said second layer being a second dielectric material with a uniform thickness, said uniform thickness of said second layer being at least equal to a thickness of said first dielectric area,
   (i) planarizing the semiconductor device to said thickness of said first dielectric area to expose said first dielectric area,
   (j) reactive ion etching said first dielectric area down to said substrate to form at least one second opening through said second layer to said substrate,
   (k) implanting ions into said substrate through said second opening to form at least one active layer of said first conductivity, said active layer having a second resistivity different from said source and drain regions,
   (l) forming first spacers in said second opening at edges of said second layer, said first spacers being made of said second dielectric material, and said first spacers reducing dimensions of said second opening to a length L,
   (m) depositing gate metal layer in said at least one second opening to a thickness exceeding said second dielectric material, said gate metal layer extending over said second dielectric material at a uniform thickness, and said gate metal layer having a depression at said second opening,
   (n) depositing a further layer over said gate metal layer to a further uniform thickness, said further layer being selected from the group consisting of titanium (Ti) and said first dielectric material,
   (o) planarizing said semiconductor device down to said gate metal layer, a portion of said further layer remaining in said depression,
   (p) etching said gate metal layer around said portion of said further layer down to said second layer by one of selective reactive ion etching and a beam of ions of a neutral gas, said portion acting as a third mask to form at least one gate electrode having said length L,
   (q) forming second spacers on exposed edges of said gate electrode to form a peripheral dielectric part around said gate electrode at right angles to said second layer, said peripheral dielectric part being of said first dielectric material, and
   (r) etching said second layer down to said surface of said substrate to expose said source and drain regions and said substrate by selective reactive ion etching, said etching being prolonged to laterally etch under said peripheral dielectric part.

2. A method according to claim 1, wherein source and drain contacts are formed by depositing on said source and drain regions a metal forming an ohmic contact with said source and drain regions, said step of depositing being carried out by using said third mask and said peripheral dielectric part to mask said gate electrode.

3. A method according to claim 2, wherein said third mask is titanium (Ti).

4. A method according to claim 2, wherein said third mask is said first dielectric material.

5. A method according to claim 1, wherein several of said first masks are formed to define several fingers and said step (d) forms several of said first dielectric areas, said several of said first dielectric areas having the shape of said several fingers, wherein said step (j) forms several of said second openings from said several fingers, and said step (k) forms several of said active layers separated by at least one region of said first conductivity and said second resistivity, wherein said step (l) forms said first spacers at edges of said several second openings, and said step (m) forms a gate metal layer at respective ones of said several second openings, and wherein said gate metal layer in said several second openings form a plurality of gate electrodes, said plurality of gate electrodes being separated by a distance equal to the sum of the thickness of said second spacers on exposed edges of respective adjacent ones of said plurality of gate electrodes.

6. A method according to claim 5, wherein source and drain contacts are formed by depositing on said source and drain regions a metal forming an ohmic contact with said source and drain regions, said step of depositing being carried out by using said third mask and said peripheral dielectric part to mask said gate electrode.

7. A method according to claim 5, wherein said third mask is titanium (Ti).

8. A method according to claim 5, wherein said third mask is said first dielectric material.

9. A method according to claim 5, wherein between step (l) and step (m), the following additional step is carried out:
- (l') forming a depression in said at least one active layer to locally reduce the thickness of said at least one active layer, said step of forming said depression being carried out by one of selective reactive ion etching and chemical etching.

10. A method according to claim 5, wherein between step (j) and step (k), the following additional step is carried out:
- (j') implanting ions of high energy into said substrate through said second opening to form a deep layer of second conductivity, and wherein said at least one active layer of said first conductivity is formed in step (k) above said deep layer.

11. A method according to claim 10, wherein said substrate is formed of semi-insulating gallium arsenide (GaAs), wherein said ions implanted in said step (f) are silicon ions implanted at a concentration of about $10^{17}$ to $10^{18}$ atoms per cm$^3$ to form said source and drain regions with a n+ conductivity, wherein said ions implanted in said step (k) are silicon ions implanted at a concentration of about $5 \times 10^{16}$ to $5 \times 10^{17}$ atoms per cm$^3$ to form said at least one active layer with a n conductivity, wherein said ions implanted in said step (j') are one of magnesium (mg) ions and beryllium (Be) ions implanted at a concentration of about $10^{16}$ to $10^{17}$ atoms per cm$^3$ to form said deep layer with a p conductivity, and wherein said ion implanting steps are carried out with an implantation annealing treatment at about 800° C. for 20 minutes.

12. A method according to claim 5, wherein said step (m) is carried out by depositing a superimposition of metallic layers selected from the group consisting of
- (i) a superimposition of tungsten (W), tantalum (Ta), and gold (Au) having thicknesses of about 200 nm, about 100 nm, and more than 500 nm, respectively;
- (ii) a superimposition of tungsten nitride (WN), tantalum nitride (TaN), and gold (Au) having thicknesses of about 200 nm, about 100 nm, and more than 500 nm, respectively; and
- (iii) a superimposition of tungsten (W) and gold (Au) having thicknesses of about 200 nm and more than 500 nm, respectively; and wherein said superimposition of multiple gate layers is formed by one of vapor deposition in vacuo and cathode sputtering.

13. A method according to claim 12, wherein after said step (r) ohmic source and drain contacts are formed by depositing a layer of a gold-germanium (Au-Ge) alloy by one of vapor deposition in vacuo and cathode sputtering on said source and drain regions, depositing a layer of nickel (Ni) by one of vapor deposition in vacuo and cathode sputtering, and heating to a temperature of about 450° C. to form a gold-germanium-nickel (Au-Ge-Ni) alloy, said Au-Ge-Ni alloy having a thickness of about 0.5 to 1 micron ($\mu$m).

14. A method according to claim 13, wherein said first dielectric material is formed of silica (SiO$_2$), and said second dielectric material is formed of silicon nitride (Si$_3$N$_4$).

15. A method according to claim 14, wherein each of said layers, except said gold and silica layers, are etched by reactive ion etching using CHF$_3$+SF$_6$ gases, wherein said gold layers are etched by a beam of ions of a neutral gas, and wherein said silica layers are etched by reactive ion etching with CHF$_3$+SF$_6$ gases to obtain etching edges inclined to said substrate or by reactive ion etching with pure CH$_3$ or CF$_4$ gases at high pressure to obtain etching edges perpendicular to said substrate.

16. A method according to claim 1, wherein between step (l) and step (m), the following additional step is carried out:
- (l') forming a depression in said at least one active layer to locally reduce the thickness of said at least one active layer, said step of forming said depression being carried out by one of selective reactive ion etching and chemical etching.

17. A method according to claim 1, wherein between step (j) and step (k), the following additional step is carried out:
- (j') implanting ions of high energy into said substrate through said second opening to form a deep layer of second conductivity, and wherein said at least one active layer of said conductivity is formed in step (k) above said deep layer.

18. A method according to claim 17, wherein said substrate is formed of semi-insulating gallium arsenide (GaAs), wherein said ions implanted in said step (f) are silicon ions implanted at a concentration of about $10^{17}$ to $10^{18}$ atoms per cm$^3$ to form said source and drain regions with a n+ conductivity, wherein said ions implanted in said step (k) are silicon ions implanted at a concentration of about $5 \times 10^{16}$ to $5 \times 10^{17}$ atoms per cm$^3$ to form said at least one active layer with a n conductivity, wherein said ions implanted in said step (j') are one of magnesium (mg) ions and beryllium (Be) ions implanted at a concentration of about $10^{16}$ to $10^{17}$ atoms per cm$^3$ to form said deep layer with a p conductivity, and wherein said ion implanting steps are carried out with an implantation annealing treatment at about 800° C. for 20 minutes.

19. A method according to claim 1, wherein said step (m) is carried out by depositing a superimposition of metallic layers selected from the group consisting of
- (i) a superimposition of tungsten (W), tantalum (Ta), and gold (Au) having thicknesses of about 200 nm, about 100 nm, and more than 500 nm, respectively;
- (ii) a superimposition of tungsten nitride (WN), tantalum nitride (TaN), and gold (Au) having thicknesses of about 200 nm, about 100 nm, and more than 500 nm, respectively; and
- (iii) a superimposition of tungsten (W) and gold (Au) having thicknesses of about 200 nm and more than 500 nm, respectively; and wherein said superimposition of multiple gate layers is formed by one of vapor deposition in vacuo and cathode sputtering.

20. A method according to claim 19, wherein after said step (r) ohmic source and drain contacts are formed by depositing a layer of a gold-germanium (Au-Ge) alloy by one of vapor deposition in vacuo and cathode sputtering on said source and drain regions, depositing a layer of nickel (Ni) by one of vapor deposition in vacuo and cathode sputtering, and heating to a temperature of about 450° C. to form a gold-germanium-nickel (Au-Ge-Ni) alloy, said Au-Ge-Ni alloy having a thickness of about 0.5 to 1 micron ($\mu$m).

21. A method according to claim 20, wherein said first dielectric material is formed of silica (SiO$_2$), and said second dielectric material is formed of silicon nitride (Si$_3$N$_4$).

22. A method according to claim 21, wherein each of said layers, except said gold and silica layers, are etched by reactive ion etching using CHF$_3$+SF$_6$ gases, wherein said gold layers are etched by a beam of ions of a neutral gas, and wherein said silica layers are etched by reactive ion etching with CHF$_3$+SF$_6$ gases to obtain etching edges inclined to said substrate or by reactive ion etching with pure CH$_3$ or CF$_4$ gases at high pressure to obtain etching edges perpendicular to said substrate.

* * * * *